(12) United States Patent
Yan

(10) Patent No.: US 10,177,017 B1
(45) Date of Patent: Jan. 8, 2019

(54) METHOD FOR CONDITIONING A PROCESSING CHAMBER FOR STEADY ETCHING RATE CONTROL

(71) Applicant: Applied Materials, Inc., Santa Clara, CA (US)

(72) Inventor: Chun Yan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/641,963

(22) Filed: Jul. 5, 2017

(51) Int. Cl.
 *H01L 21/02* (2006.01)
 *H01L 21/67* (2006.01)
 *H01L 21/683* (2006.01)
 *H01L 21/673* (2006.01)
 *H01J 37/32* (2006.01)

(52) U.S. Cl.
 CPC .... *H01L 21/67225* (2013.01); *H01J 37/3211* (2013.01); *H01J 37/3244* (2013.01); *H01J 37/32091* (2013.01); *H01L 21/67389* (2013.01); *H01L 21/6833* (2013.01); *H01J 37/32798* (2013.01); *H01J 37/32862* (2013.01); *H01J 2237/334* (2013.01)

(58) Field of Classification Search
 CPC ........... H01J 37/32082; H01J 37/32862; H01J 37/32798; H01J 37/32787; H01J 2237/3341; H01J 2237/342; H01L 21/02049; H01L 21/0217; H01L 21/02348; H01L 21/02068
 USPC ........ 216/67, 68; 134/1.1, 1.2, 1.3, 19, 22.1; 438/706, 714
 See application file for complete search history.

(56) References Cited

U.S. PATENT DOCUMENTS

| | | | |
|---|---|---|---|
| 5,326,723 A * | 7/1994 | Petro | B08B 7/0035 134/1.2 |
| 6,905,972 B2 | 6/2005 | Oda | |
| 7,097,716 B2 | 8/2006 | Barnes et al. | |
| 7,270,761 B2 | 9/2007 | Wang et al. | |
| 2003/0010355 A1 | 1/2003 | Nowak et al. | |
| 2004/0077511 A1 | 4/2004 | Barnes et al. | |
| 2012/0040536 A1 | 2/2012 | Furuta et al. | |
| 2013/0087174 A1 | 4/2013 | Sun et al. | |
| 2014/0116470 A1* | 5/2014 | Su | C23C 16/4404 134/22.1 |
| 2014/0252565 A1* | 9/2014 | Greer | H01L 21/31122 257/635 |
| 2017/0323768 A1* | 11/2017 | Zhang | H01J 37/32082 |

* cited by examiner

*Primary Examiner* — Lan Vinh

(74) *Attorney, Agent, or Firm* — Patterson + Sheridan, LLP

(57) ABSTRACT

Embodiments of the present disclosure provide methods for conditioning a plasma processing chamber to maintain a reliable and predicable processing conditions while performing a oxide removal process on a substrate. In one embodiment, a method for conditioning a plasma processing chamber includes supplying a first gas mixture including an inert gas into a processing chamber a first period of time in absent of a substrate, supplying a second gas mixture including an inert gas, a hydrogen containing gas and a halogen containing gas for a second period of time in absent of the substrate, and supplying a third gas mixture including an inert gas and a hydrogen containing gas for a third period of time in absent of the substrate in the processing chamber.

17 Claims, 3 Drawing Sheets

METHOD FOR CONDITIONING A PROCESSING CHAMBER FOR STEADY ETCHING RATE CONTROL

BACKGROUND

Field

Embodiments of the present invention relate generally to semiconductor substrate processing and, more particularly, to systems and methods for conditioning a processing chamber, such as a pre-cleaning processing chamber that may be utilized to clean native oxide and residue from a substrate.

Description of the Related Art

In the microfabrication of integrated circuits and other devices, electrical interconnect features, such as contacts, vias, and lines, are commonly constructed on a substrate using high aspect ratio apertures formed in a dielectric material. The presence of native oxides and other contaminants such as etch residue within these small apertures is highly undesirable, contributing to defect formation during subsequent film growth or metalization of the aperture and increasing the electrical resistance of the interconnect feature.

A native oxide typically forms when a substrate surface is exposed to oxygen and/or water. Oxygen exposure occurs when substrates are moved between processing chambers at atmospheric or ambient conditions, or when a small amount of oxygen/moisture remains in a processing chamber and/or transfer chamber. In addition, native oxides may result from contamination during etching processes, prior to or after a deposition process. Therefore, a native oxide layer is typically undesirable and needs to be removed prior to subsequent fabrication processes.

In conventional practice, a pre-cleaning process is often performed to remove native oxide from a substrate surface in a pre-cleaning plasma processing chamber. However, in production line, the pre-cleaning plasma processing chamber may be idled for a period of time after completion of a first load of substrates but prior to processing of a second load of the substrates, resulting in chamber interior temperature drop or chamber inner surface condition change. Fluctuation in temperature or inner surface condition of the pre-cleaning plasma processing chamber often results in cleaning rate unstable or cleaning efficiency drift of the native oxide removal in the first couple substrates processed after the chamber idle for a period of time.

Accordingly, there is a need in the art for methods of maintaining stability of oxide removal rate on a substrate in a processing chamber.

SUMMARY

Embodiments of the present disclosure provide methods for conditioning a plasma processing chamber to maintain a reliable and predicable processing conditions while performing a oxide removal process on a substrate. In one embodiment, a method for conditioning a plasma processing chamber includes supplying a first gas mixture including an inert gas into a processing chamber a first period of time in absent of a substrate, supplying a second gas mixture including an inert gas, a hydrogen containing gas and a halogen containing gas for a second period of time in absent of the substrate, and supplying a third gas mixture including an inert gas and a hydrogen containing gas for a third period of time in absent of the substrate in the processing chamber.

In another example, a method for conditioning a plasma processing chamber includes applying a RF power to a plasma processing chamber having a first gas mixture, a second gas mixture and a third gas mixture sequentially supplied thereto to condition the plasma processing chamber in absent a substrate disposed therein, wherein the first, the second and the third gas mixtures includes at least an inert gas.

In yet another example, a method for conditioning a plasma processing chamber includes sequentially supplying a first gas mixture, a second gas mixture and a third gas mixture into a plasma processing chamber to form a plasma therein in absent a substrate disposed therein, wherein the process pressure is controlled differently while supplying the first and the second gas mixtures.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

Figure 1:
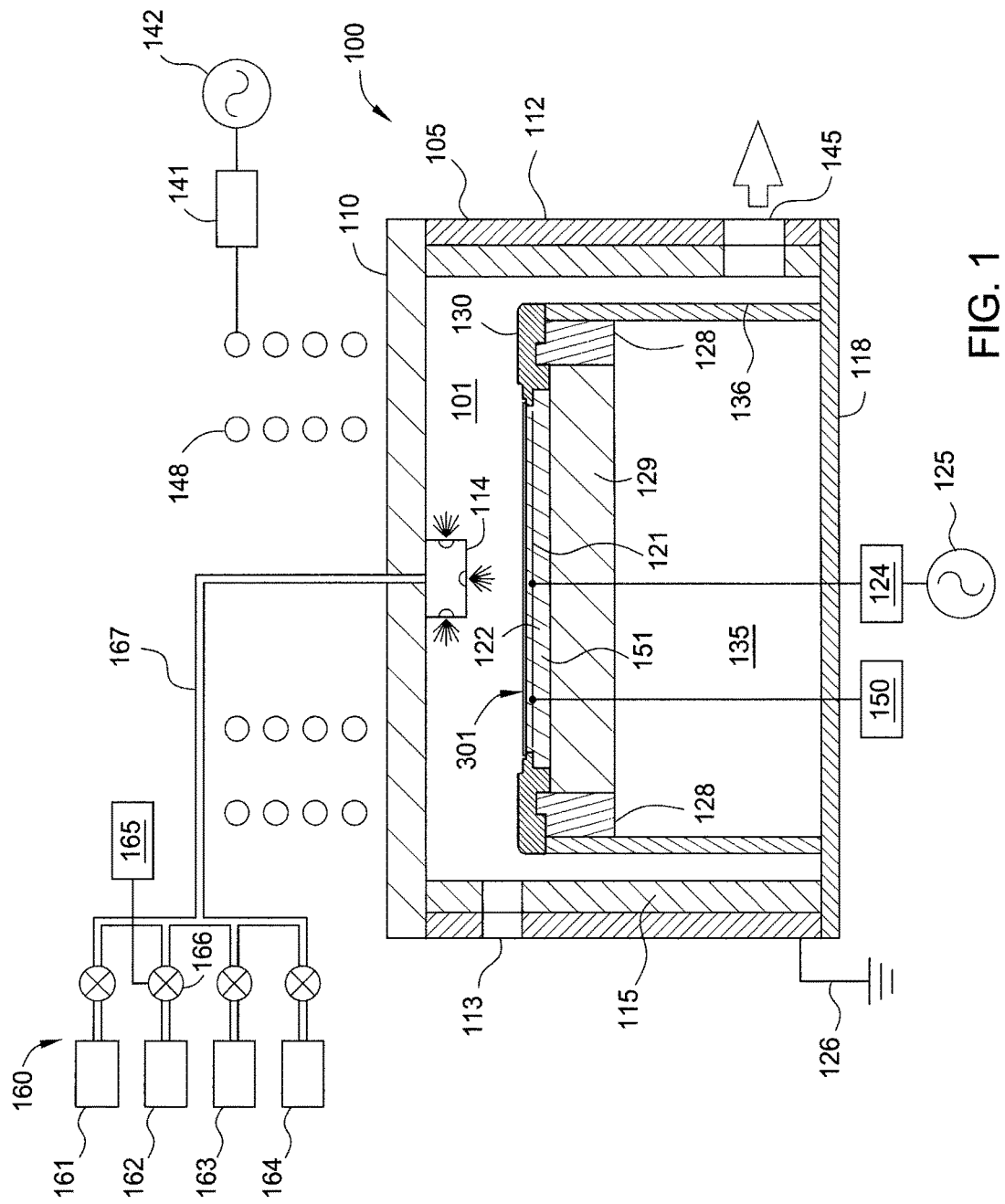
FIG. 1 is a schematic cross-sectional view of a processing chamber configured to perform a conditioning process according to one or more embodiments of the disclosure.

It is to be noted, however, that the appended drawings illustrate only exemplary embodiments of this invention and are therefore not to be considered limiting of its scope, for the invention may admit to other equally effective embodiments.

DETAILED DESCRIPTION

As will be explained in greater detail below, a plasma processing chamber is conditioned prior to performing a surface oxide removal process on a substrate disposed in the plasma processing chamber. While performing the chamber conditioning process, the substrate is absent from the plasma processing chamber. After the chamber conditioning process is completed, the surface oxide removal process may then performed to perform on the substrate disposed in the processing chamber prior to forming a device structure, such as a gate structure, a contact structure, a metal-insulator-semiconductor (MIS), a metal silicide layer, or the like, on the substrate.

The term "substrate" as used herein refers to a layer of material that serves as a basis for subsequent processing operations and includes a surface to be cleaned. For example, the substrate can include one or more material containing IV group or III-V group containing compounds, such as Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Embodiments of the present disclosure describe conditioning processes that may be used to condition a plasma processing chamber prior to performing an oxide removal process (e.g., also called a surface cleaning process) on a substrate. The conditioning process performed on the plasma processing chamber may assist stabilizing the chamber conditions to a steady state prior to the oxide removal process performed on a substrate so that the first substrate effect (e.g., the oxide removal rate performed on a first substrate departed from the oxide removal rate performed on subsequent substrates after the first substrate) may be minimized and eliminated. The substrate surface may include a IV group or III-V group (or Ge containing) containing materials. The oxide removal process (e.g., also called a surface cleaning process) is performed to react with the native oxide or other contaminants and efficiently remove undesired native oxides and/or other contaminants from the substrate surface.

FIG. 1 is a simplified cutaway view for an exemplary processing chamber 100 suitable for performing a conditioning process to the processing chamber 100 prior to cleaning a substrate 301 disposed thereon. The exemplary processing chamber 100 is suitable for performing a conditioning process. One example of the process chamber 100 that may be adapted to benefit from the disclosure is an AdvantEdge™ Mesa™ Etch processing chamber, available from Applied Materials, Inc., located in Santa Clara, Calif. It is contemplated that other process chambers, including those from other manufactures, may be adapted to practice embodiments of the disclosure.

The plasma processing chamber 100 (e.g., a pre-cleaning plasma processing chamber) includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the cleaning plasma processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 301 during processing. The support pedestal 135 may include an electrostatic chuck 122 for holding the substrate 301 during processing. The electrostatic chuck (ESC) 122 uses the electrostatic attraction to hold the substrate 301 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 301 positioned thereon. The RF power supply 125 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 301.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about minus about 25 degrees Celsius to about 500 degrees Celsius for certain embodiments.

The cooling base 129 is provided to assist in controlling the temperature of the substrate 301. To mitigate process drift and time, the temperature of the substrate 301 may be maintained substantially constant by the cooling base 129 throughout the time the substrate 301 is in the cleaning chamber. In one embodiment, the temperature of the substrate 301 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the plasma processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

The substrate 301 has various film layers disposed thereon which may include at least one IV group or III-V group (or germanium containing material) disposed on the substrate 301. The various film layers may require cleaning recipes which are unique for the different compositions of the other film layers in the substrate 301. Each plasma processing chamber may be configured to clean the substrate 301 with one or more of the cleaning recipes. In one embodiment, the plasma processing chamber 100 is configured to at least clean a III-V group material layer 302 (depicted in FIG. 3A-3B) disposed on the substrate 301. For processing parameters provided herein, the plasma processing chamber 100 is configured to process a 300 mm diameter substrate, i.e., a substrate having a plan area of about 0.0707 $m^2$, or a 450 mm diameter substrate. The process parameters, such as flow and power, may generally be scaled proportionally with the change in the chamber volume or substrate plan area.

Figure 2:
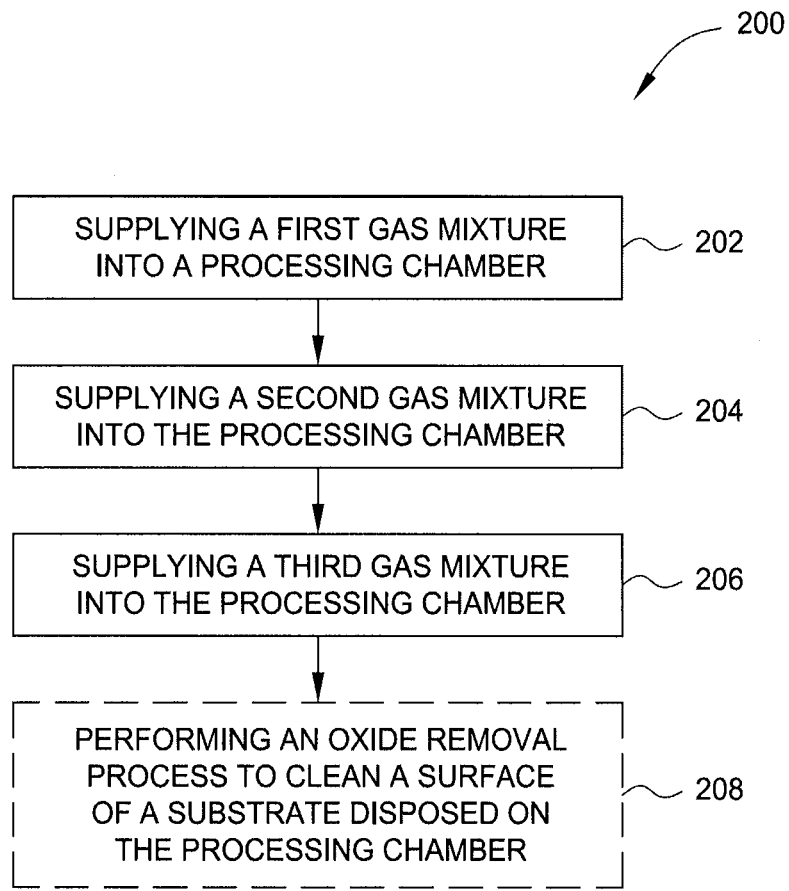
FIG. 2 is a flowchart of a method for performing a conditioning process in a processing chamber, according to one or more embodiments of the present disclosure.
Figure 3A:
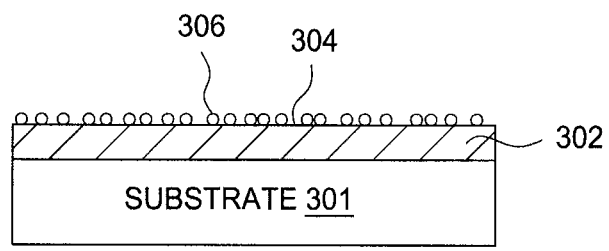
FIGS. 3A-3B are cross-sectional views of a substrate processed in the processing chamber according to the method depicted in FIG. 2, according to one or more embodiments of the present disclosure.
Figure 3B:
Figure 3B:
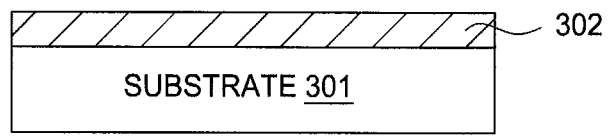

FIG. 2 is a flow diagram of a process 200 for performing a conditioning process in the plasma processing chamber, such as the plasma processing chamber 100 depicted in FIG. 1. FIGS. 3A-3B are cross-sectional views of the substrate when performing the native oxide removal process at the different manufacturing stages depicted in FIG. 2 after the chamber conditioning process is performed and completed in the plasma processing chamber 100.

The process 200 starts at operation 202 by supplying a first gas mixture to warm up the interior of the plasma processing chamber 100 in absence of a substrate disposed therein. As the plasma processing chamber 100 may be idled for a period of time or after a plasma process performed previously, the first gas mixture at operation 202 may be supplied to warm up interior of the processing chamber 100, which may have a chamber interior temperature cooler than its desired temperature range due to the inactivity or long-time chamber idle. A RF power may be applied to form a plasma in presence of the first gas mixture in the processing chamber so as to provide the desired thermal energy to the interior of the plasma processing chamber 100, including chamber walls, substrate pedestal, or other components disposed in the plasma processing system.

The plasma generated in the first gas mixture may also help reduce the moisture in the processing chamber 100. The removal of the moisture in the plasma processing chamber 100 may prevent the substrate from exposing to moisture after transferring in to the plasma processing chamber for performing the oxide removal cleaning process after the chamber conditioning process is completed.

While performing the conditioning process at operation 202, no substrate is present in the plasma processing system 100, e.g., in absence of a substrate disposed therein. In some cases, a dummy substrate, such as a clean silicon substrate without film stack disposed thereon, may be disposed in the processing chamber to protect the surface of the substrate pedestal as needed.

In one example, the first gas mixture includes at least an inert gas, such as Ar or He and the like. In one example, the inert gas supplied in the first gas mixture is Ar.

During the supplying of the first gas mixture at operation 202, several process parameters may be controlled. In one embodiment, the a RF source power may be supplied to the plasma processing chamber 100 between about 500 Watt and about 2000 Watt, such as about 1000 Watts, with or without RF bias power. The pressure of the processing chamber may be controlled at a pressure range less than 100 mTorr, such as between about 5 mTorr and about 70 mTorr, such as about 20 mTorr.

The Ar gas supplied in the first gas mixture may be supplied into the processing chamber at a flow rate between about 100 sccm and about 1500 sccm, for example about 1000 sccm. The process time at operation 202 may be performed between about 5 second and about 200 seconds such as about 10 seconds.

At operation 204, a second gas mixture is supplied to the processing chamber 100. The first gas mixture supplied at operation 202 may be terminated prior to supplying the second gas mixture supplied to the processing chamber 100. Some pumping/purging steps may be performed after the first gas mixture is terminated but prior to supplying the second gas mixture. Alternatively, the first gas mixture may be switched to the second gas mixture without interruption to continuously perform the chamber conditioning process without intermission or recess.

Similarly, while performing the conditioning process at operation 204, no substrate is present in the plasma processing system 100, e.g., in absence of a substrate disposed therein. In some cases, a dummy substrate, such as a clean silicon substrate without film stack disposed thereon, may be disposed in the processing chamber to protect the surface of the substrate pedestal as needed.

The second gas mixture at operation 204 may be supplied to condition the interior of the processing chamber and form a thin coating layer, if any, for chamber interior surface protection. A RF power may be applied to form a plasma in presence of the second gas mixture in the processing chamber so as to provide the enough plasma energy to treat and/or lightly coat a thin layer in the interior of the plasma processing chamber 100.

In one example, the second gas mixture includes at least an inert gas, such as Ar or He and the like, a nitrogen containing gas and a halogen containing gas. In one example, the inert gas supplied in the second gas mixture is Ar. The nitrogen containing gas supplied in the second gas mixture is $N_2$, $NH_3$, $NF_3$ or the like. The halogen containing gas supplied in the second gas mixture is $NF_3$ or carbon fluoride containing gas or the like. In one example, the second gas mixture includes Ar, $NF_3$ and $NH_3$.

During the supplying of the second gas mixture at operation 204, several process parameters may be controlled. In one embodiment, the a RF source power may be supplied to the plasma processing chamber 100 between about 200 Watt and about 1000 Watt, such as about 300 Watts, with or without RF bias power. The pressure of the processing chamber may be controlled at a pressure range greater than 50 mTorr but less than 500 mTorr, such as between about 50 mTorr and about 200 mTorr, such as about 150 mTorr.

It is noted that the process pressure controlled at operation 204 is greater than the process pressure controlled at operation 202. Furthermore, the chamber interior temperature, such as the temperature of the substrate support pedestal or chamber interior sidewalls, controlled at operation 204 is relatively higher than the chamber interior temperature controlled at operation 202.

It is believed that the relatively high pressure, such as greater than 50 mTorr, controlled at operation 204 may assist a relatively better flow circulation toward the interior chamber wall of the processing chamber 100. Furthermore, the relatively high temperature, such as greater than 50 degrees Celsius at the substrate support pedestal, may also prevent undesired materials to be overly accumulated thereon (e.g., also referred as a light coating process), thus resulting in undesired and non-uniform over coating on the interior wall of the processing chamber 100. Over coating or over accumulation of the materials on the chamber walls may render the defect creation from the chamber wall or pedestal surface. Thus, by utilizing a light coating process at operation 204 with relatively greater process pressure and higher chamber interior temperature, the chamber interior wall may be protected while maintaining process parameters at a desired and more accurate range within a relatively short time frame so that reliable, predicable and controllable process conditions may be obtained and managed.

In one example, the process pressure at operation 204 is about 20 percent and about 50 percent greater than the operation at 202. The process temperature at operation 204 is about 20 percent and about 50 percent greater than the process temperature at operation 202, particular the temperature controlled from the substrate support pedestal. In one specific example, the process pressure regulated at operation 204 is about 150 mTorr and the temperature regulated on the substrate support pedestal at operation 204 is about 60 degrees Celsius. The process time at operation 204 is about 2 seconds and about 60 seconds, such as about 5 seconds.

At operation 206, a third gas mixture is supplied to the processing chamber 100. Similarly, the second gas mixture supplied at operation 204 may be terminated prior to supplying the third gas mixture supplied to the processing chamber 100. Some pumping/purging steps may be performed after the second gas mixture is terminated but prior to supplying the third gas mixture. Alternatively, the second gas mixture may be switched to the third gas mixture without interruption to continuously perform the chamber conditioning process without intermission or recess.

Similarly, while performing the conditioning process at operation 206, no substrate is present in the plasma processing system 100, e.g., in absence of a substrate disposed therein. In some cases, a dummy substrate, such as a clean silicon substrate without film stack disposed thereon, may be disposed in the processing chamber to protect the surface of the substrate pedestal as needed.

The third gas mixture at operation 206 may be supplied to condition the interior of the processing chamber and form a thin coating layer, if any, for chamber interior surface protection. A RF power may be applied to form a plasma in presence of the third gas mixture in the processing chamber so as to provide a relatively high hydrogen to Ar ratio in the plasma, which is believed to assist the processing chamber to reach to a stable condition. In one example, the third gas mixture includes at least an inert gas, such as Ar or He and the like, and a hydrogen containing gas, such as $H_2$, $H_2O_2$, $H_2O$, $NH_3$ and the like. In one example, the inert gas supplied in the second gas mixture is Ar. The hydrogen containing gas supplied in the third gas mixture is $H_2$, or $NH_3$. In one example, the third gas mixture includes Ar and $NH_3$.

The Ar gas supplied in the third gas mixture may be supplied into the processing chamber at a flow rate between about 100 sccm and about 2000 sccm, for example about 1000 sccm. The hydrogen containing gas, such as $NH_3$, is supplied into the processing chamber at a flow rate between about 10 sccm and about 500 sccm, for example about 300 sccm. The process time at operation 206 may be performed between about 5 second and about 300 seconds, such as about 40 seconds.

It is believed that the hydrogen elements from the hydrogen containing gas may provide relatively high hydrogen to Ar (H/Ar) ratio, which is believed to be correlated to the oxide etching rate for the oxide removal process performed subsequently. It is believed that higher hydrogen to Ar (H/Ar) ratio may also help the chamber condition to reach to a stable condition that may remove and/or etch an native oxide layer with a relatively stable etching rate. Thus, the hydrogen containing gas and the inert gas supplied in the third gas mixture is configured to stabilize the processing chamber condition so as to provide a reliable and a stabilized environment ready to receive a substrate for performing an oxide removal process on the substrate.

It is noted that in the chamber conditioning process performed at operation 202, 204, 206, a substrate (e.g., a production substrate) is not positioned in the processing chamber 100. In certain embodiments, a dummy substrate may be utilized to be disposed on the substrate support pedestal as needed for protection.

After the operation 202, 204, and 206 is performed, the chamber conditioning process is then considered completed so that the processing chamber is ready to perform a native oxide removal process or a surface oxide removal process, optionally, on the substrate disposed or transferred into the processing chamber 100 at operation 208.

At operation 208, optionally, the oxide removal process is performed on the substrate 301 to remove oxide from the substrate 301. In one embodiment, the substrate 301 may be a 200 mm, 300 mm or 450 mm silicon wafer, or other substrate used to fabricate microelectronic devices and the like. In one embodiment, the substrate 301 may be a material such as III-V group compound containing substrate including gallium arsenide, indium phosphine and the like, crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have a circular wafer, as well as, rectangular or square panels. Unless otherwise noted, the examples described herein are conducted on substrates having a 300 mm diameter or a 450 mm diameter.

In one embodiment, the substrate 301 has a material layer 302 disposed thereon. The material layer 302 may be a III-V compound containing layer or IV group Si or germanium (Ge) containing layer. In some examples wherein the material layer 302 is not present, the substrate 301 itself may be a III-V compound containing layer or germanium (Ge) containing layer. Suitable examples of the germanium (Ge) containing layer include Ge or SiGe, and the like. Suitable examples of the III-V compound containing layer include GaAs, InP, InAs, GaAs, GaP, InGaAs, InGaAsP, GaSb, InSb, the like, or combinations thereof.

Native oxide 306 is formed on a surface 304 of the material layer 302 on the substrate 301, due to the exposure to either atmosphere or to one or more fabrication processes that cause native oxide 306 to form, such as a wet or a moisture process.

As discussed above, as the substrate 301 may be exposed to air or ambient atmosphere, native oxide 306 formed on the substrate surface 304 may have oxygen, nitrogen, carbon, sulfur, or other elements commonly contained in the air. Accordingly, the native oxide removal process is performed after the chamber conditioning process to remove the native oxide 306 including not only the oxide layer but also other derivative layers, including carbon, nitrogen, sulfur elements or the like, that may be found on the substrate surface 304 with a reliable, predicable and steady etching rate.

The native oxide removal process at operation 208 is performed by supplying a oxide removal gas mixture into the processing chamber 100 to form a plasma from the oxide removal gas mixture for removing the treated native oxide 308. In one embodiment, the oxide removal gas mixture used to remove native oxides 304 is a mixture of inert gas and hydrogen containing gas. Suitable examples of the hydrogen containing gas include $H_2$, $NH_3$, $CH_4$, $C_2H_4$ and the like. Suitable examples of the inert gas supplied in the cleaning gas mixture include He, Ar or the like. In one example, the hydrogen containing gas supplied in the oxide removal gas mixture is $H_2$ and the inert gas supplied in the cleaning gas mixture is Ar. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

The operating pressure within the chamber can be varied. The pressure is maintained between about 0.2 Torr and about 5 Torr. A RF source power may be applied, such as less than 500 Watts, to maintain a plasma in the cleaning gas mixture. A relatively low RF bias power less than 40 Watts may also be optionally supplied in the oxide removal gas mixture. The relatively low RF regime controlled during the process may assist providing gentle plasma reaction to remove the native oxide 306 from the substrate surface without overly damage the substrate surface. The substrate temperature is controlled at a temperature less than 150 degrees Celsius, such as between about 30 degrees Celsius and about 90 degrees Celsius.

In one embodiments, the substrate is subjected to perform the native oxide removal process for a period of time of between about 5 seconds to about 5 minutes, depending on the operating temperature, pressure and flow rate of the gas. For example, the substrate can be exposed for about 5 seconds to about 90 seconds. In an exemplary embodiment, the substrate is exposed for about 60 seconds or less.

After oxide removal process at operation 208, the surface 304 of the material layer 302 is then exposed and cleaned.

Thus, methods for conditioning a plasma processing chamber to maintain a reliable and predicable processing condition while performing a oxide removal process on a substrate are provided. The plasma processing chamber is conditioned by a three operation process to condition the processing chamber so as to assist the plasma processing chamber reaching to a stable condition, e.g., chamber temperature quickly reached to a predetermined range as well as sufficient chamber protection for processing. By such three operation process, the plasma processing chamber is conditioned to provide a reliable processing environment to a substrate subsequently transferred into the processing chamber to perform an oxide removal process. A substrate is not present in the processing chamber while performing such chamber conditioning process until an oxide removal process is performed to remove native oxide layer on the substrate.

While the foregoing is directed to embodiments of the present invention, other and further embodiments of the invention may be devised without departing from the basic scope thereof, and the scope thereof is determined by the claims that follow.

I claim:

1. A method for conditioning a plasma processing chamber, comprising:
   supplying a first gas mixture including an inert gas into a processing chamber a first period of time in absent of a substrate;
   supplying a second gas mixture including an inert gas, a hydrogen containing gas and a halogen containing gas for a second period of time in absent of the substrate;
   maintaining a first processing pressure in the plasma processing chamber when supplying the first gas mixture and maintaining a second processing pressure when supplying a second gas mixture, wherein the second processing pressure is greater than the first processing pressure and the first processing pressure are between about 5 mTorr and about 70 mTorr; and supplying a third gas mixture including an inert gas and a hydrogen containing gas for a third period of time in absent of the substrate in the processing chamber.

2. The method of claim 1, wherein the second processing pressure is about 20 percent and about 50 percent greater than the first processing pressure.

3. The method of claim 1, wherein the first gas mixture comprises Ar gas.

4. The method of claim 1, wherein the halogen containing gas supplied in the second gas mixture is selected from the group consisting of $NF_3$ and carbon fluoride containing gas.

5. The method of claim 1, wherein the nitrogen containing gas supplied in the second gas mixture is selected from a group consisting $N_2$, $NH_3$ and $NF_3$.

6. The method of claim 1, wherein the second gas mixture includes Ar, $NH_3$ and $NF_3$.

7. The method of claim 1, wherein the third gas mixture includes Ar and $H_2$.

8. The method of claim 1, further comprising:
performing a native oxide removal process on a substrate transferred into the processing chamber after the third gas mixture is terminated from the processing chamber.

9. The method of claim 8, wherein the substrate includes a material comprising a IV group material or group III-V material.

10. The method of claim 1 further comprising:
maintaining a first temperature of a substrate support pedestal disposed in the plasma processing chamber when supplying the first gas mixture while maintaining a second temperature of the substrate support pedestal when supplying a second gas mixture.

11. The method of claim 10, wherein the second temperature is greater than the first temperature.

12. The method of claim 11, wherein the second temperature is about 20 percent and about 50 percent higher from the first temperature.

13. The method of claim 11, wherein the second temperature is maintained greater than 50 degrees Celsius.

14. A method for conditioning a plasma processing chamber, comprising:
applying a RF power to a plasma processing chamber having a first gas mixture, a second gas mixture and a third gas mixture sequentially supplied thereto to condition the plasma processing chamber in absent a substrate disposed therein, wherein the first, the second and the third gas mixtures includes at least an inert gas; and maintaining a first processing pressure in the plasma processing chamber when supplying the first gas mixture and maintaining a second processing pressure when supplying a second gas mixture, wherein the second processing pressure is greater than the first processing pressure and the first processing pressure are between about 5 mTorr and about 70 mTorr.

15. The method of claim 14, further comprising:
maintaining a substrate support temperature at a higher range while supplying the second gas mixture than when supplying the first gas mixture.

16. The method of claim 14, wherein the third gas mixture includes an inert gas and hydrogen containing gas.

17. A method for conditioning a plasma processing chamber, comprising:
sequentially supplying a first gas mixture, a second gas mixture and a third gas mixture into a plasma processing chamber to form a plasma therein in absent a substrate disposed therein; and maintaining a first processing pressure in the plasma processing chamber when supplying the first gas mixture and maintaining a second processing pressure when supplying a second gas mixture, wherein the second processing pressure is greater than the first processing pressure and the first processing pressure are between about 5 mTorr and about 70 mTorr.

* * * * *